(12) United States Patent  (10) Patent No.: US 7,829,906 B2
Donofrio  (45) Date of Patent: Nov. 9, 2010

(54) THREE DIMENSIONAL FEATURES ON LIGHT EMITTING DIODES FOR IMPROVED LIGHT EXTRACTION

(75) Inventor: Matthew Donofrio, Raleigh, NC (US)

(73) Assignee: Cree, Inc., Durham, NC (US)

( * ) Notice: Subject to any disclaimer, the term of this patent is extended or adjusted under 35 U.S.C. 154(b) by 128 days.

(21) Appl. No.: 12/030,404

(22) Filed: Feb. 13, 2008

(65) Prior Publication Data

US 2008/0135866 A1 Jun. 12, 2008

Related U.S. Application Data

(62) Division of application No. 11/461,018, filed on Jul. 31, 2006, now Pat. No. 7,384,809.

(51) Int. Cl.
 H01L 33/00 (2010.01)
 H01L 21/00 (2010.01)
(52) U.S. Cl. .......................... 257/98; 257/103; 438/29; 438/69; 438/71
(58) Field of Classification Search ................. None
 See application file for complete search history.

(56) References Cited

U.S. PATENT DOCUMENTS

| | | | |
|---|---|---|---|
| 3,954,534 A | 5/1976 | Scifres et al. |
| 4,545,366 A | 10/1985 | O'Neill |
| 4,672,949 A | 6/1987 | O'Neill |
| 4,711,972 A | 12/1987 | O'Neill |
| 4,719,904 A | 1/1988 | O'Neill |
| 4,865,685 A | 9/1989 | Palmour |
| 4,915,981 A | 4/1990 | Traskos et al. |
| 4,918,497 A | 4/1990 | Edmond |
| 4,946,547 A | 8/1990 | Palmour et al. |
| 4,966,862 A | 10/1990 | Edmond |
| 5,027,168 A | 6/1991 | Edmond |
| 5,087,535 A | 2/1992 | Hirokane et al. |
| 5,210,051 A | 5/1993 | Carter, Jr. |
| 5,210,766 A | 5/1993 | Winer et al. |
| 5,338,944 A | 8/1994 | Edmond et al. |

(Continued)

FOREIGN PATENT DOCUMENTS

EP 442002 8/1991

(Continued)

OTHER PUBLICATIONS

Pan et al. "Improvement of InGaN-GaN Light-Emitting Diodes with Surface-Textured Indium-Tin-Oxide Transparent Ohmic Contacts," IEEE Photonics Technology Letters, vol. 15, No. 5, May 2003.

(Continued)

*Primary Examiner*—Alonzo Chambliss
(74) *Attorney, Agent, or Firm*—Myers Bigel Sibley & Sajovec (57) ABSTRACT

A method is disclosed for obtaining a high-resolution lenticular pattern on the surface of a light emitting diode. The method comprises imprinting a patterned sacrificial layer of etchable material that is positioned on a semiconductor surface that is in turn adjacent a light emitting active region, and thereafter etching the imprinted sacrificial layer and the underlying semiconductor to transfer an imprinted pattern into the semiconductor layer adjacent the light emitting active region.

10 Claims, 9 Drawing Sheets

U.S. PATENT DOCUMENTS

| | | | |
|---|---|---|---|
| 5,393,993 | A | 2/1995 | Edmond et al. |
| 5,416,342 | A | 5/1995 | Edmond et al. |
| 5,498,297 | A | 3/1996 | O'Neill et al. |
| 5,505,789 | A | 4/1996 | Fraas et al. |
| 5,523,589 | A | 6/1996 | Edmond et al. |
| 5,604,135 | A | 2/1997 | Edmond et al. |
| 5,631,190 | A | 5/1997 | Negley |
| 5,739,554 | A | 4/1998 | Edmond et al. |
| 5,779,924 | A | 7/1998 | Krames et al. |
| 5,793,062 | A | 8/1998 | Kish, Jr. et al. |
| 5,837,576 | A | 11/1998 | Chen et al. |
| 5,912,477 | A | 6/1999 | Negley |
| 6,031,179 | A | 2/2000 | O'Neill |
| 6,075,200 | A | 6/2000 | O'Neill |
| 6,111,190 | A | 8/2000 | O'Neill |
| 6,120,600 | A | 9/2000 | Edmond et al. |
| 6,177,688 | B1 | 1/2001 | Linthicum et al. |
| 6,187,606 | B1 | 2/2001 | Edmond et al. |
| 6,201,262 | B1 | 3/2001 | Edmond et al. |
| 6,393,685 | B1 | 5/2002 | Collins |
| 6,410,348 | B1 | 6/2002 | Chen et al. |
| 6,410,942 | B1 | 6/2002 | Thibeault et al. |
| 6,483,196 | B1 | 11/2002 | Wojnarowski et al. |
| 6,504,180 | B1 | 1/2003 | Heremans et al. |
| 6,639,931 | B1 | 10/2003 | Dowd et al. |
| 6,657,236 | B1 | 12/2003 | Thibeault et al. |
| 6,747,298 | B2 | 6/2004 | Slater, Jr. et al. |
| 6,784,512 | B2 | 8/2004 | Yamaguchi et al. |
| 6,791,119 | B2 | 9/2004 | Slater, Jr. et al. |
| 6,804,062 | B2 | 10/2004 | Atwater et al. |
| 6,821,804 | B2 | 11/2004 | Thibeault et al. |
| 6,888,167 | B2 | 5/2005 | Slater, Jr. et al. |
| 6,943,117 | B2 | 9/2005 | Jeong et al. |
| 7,211,833 | B2 | 5/2007 | Slater, Jr. et al. |
| 7,250,635 | B2 | 7/2007 | Lee et al. |
| 7,384,809 | B2 * | 6/2008 | Donofrio ............ 438/29 |
| 7,419,912 | B2 * | 9/2008 | Donofrio ............ 438/694 |
| 2002/0123164 | A1 | 9/2002 | Slater, Jr. et al. |
| 2003/0006418 | A1 | 1/2003 | Emerson et al. |
| 2003/0006527 | A1 | 1/2003 | Rabolt et al. |
| 2004/0056260 | A1 | 3/2004 | Slater, Jr. et al. |
| 2004/0232410 | A9 | 11/2004 | Dahmani et al. |
| 2005/0151138 | A1 | 7/2005 | Slater, Jr. et al. |
| 2005/0194584 | A1 | 9/2005 | Slater, Jr. et al. |
| 2005/0227379 | A1 | 10/2005 | Donofrio |
| 2006/0269853 | A1 | 11/2006 | Yang |
| 2007/0080365 | A1 | 4/2007 | Watanabe |

FOREIGN PATENT DOCUMENTS

| | | |
|---|---|---|
| EP | 1 263 058 A2 | 5/2005 |
| EP | 1 690 301 | 8/2006 |
| GB | 2221791 | 2/1990 |
| WO | 2002/041364 A2 | 5/2002 |
| WO | WO 02/41362 A2 | 5/2002 |
| WO | WO 02/41362 A3 | 5/2002 |
| WO | WO 02/073705 A2 | 9/2002 |
| WO | WO 03/017385 | 2/2003 |
| WO | WO 2005/048363 A2 | 5/2005 |
| WO | WO 2005/104253 A1 | 11/2005 |

OTHER PUBLICATIONS

Shafeev et al. "Uncongruent laser ablation and electroless metallization of SiC," Applied Physics Letters, vol. 68, No. 6, Feb. 5, 1996.

International Search Report and Written Opinion of the International Searching Authority for Corresponding PCT Appliction No. PCT/US2005/001933, mailed on Aug. 6, 2005.

Boehlen et al., "Laser Micro-Machining of High Density Optical Structures on Large Substrates," Exitech Ltd, Oxford Industrial Park, 10 pages.

Craford, Overview of Device Issues in High-Brightness Light-Emitting Diodes, Chapter 2, High Brightness Light Emitting Diodes: Semiconductors and Semimetals, vol. 48, Stringfellow et al. ed., Academic Press, 1997, pp. 47-63.

Köck et al., "Strongly Directional Emission from AlGaAs/GaAs Light Emitting Diodes," Applied Physics Letters, 57(22): 2327-2329 (Nov. 26, 1990).

Krames at al., "High Power Truncated-Inverted Pyramid (AlxGa1-x)0,5In0.5P/GaP light-emitting diodes exhibiting >50% external quantum efficiency," Applied Physics Letters, 75(16): 2365-2367 (Oct. 18, 1999).

Shnitzer et al., "30% External Quantum Efficiency from Surface Textured, Thin-Film Light Emitting Diodes," Applied Physics Letters 63(16): 2174-2176 (Oct. 18, 1993).

Shnitzer et al., "Ultrahigh Spontaneous Emission Quantum Efficiency, 99.7% Internally and 72% Externally, from AlGaAs/GaAs/AlGaAs Double Heterostructures," Applied Physics Letters, 62(2): 131-133 (Jan. 11, 1993).

Yamada et al. "InGaN-Based Near-Ultraviolet and Blue-Light-Emitting Diodes with High External Quantum Efficiency Using a Patterned Sapphire Substrate and a Mesh Electrode," Jpn J Appl Phys vol. 41 pt. 2 No. 12b, pp. L1431-L1433 (2002).

Micro Chem catalog, "Nano SU-8, Negative Tone Photoresist Formulations 2-25," Feb. 2002.

Office Action, European Patent Application No. 05 711 77.1, Mar. 9, 2007, 10 pages.

* cited by examiner

THREE DIMENSIONAL FEATURES ON LIGHT EMITTING DIODES FOR IMPROVED LIGHT EXTRACTION

RELATED APPLICATIONS

This application is a divisional of Ser. No. 11/461,018 filed Jul. 31, 2006 (now U.S. Pat. No. 7,384,809) which is a continuation in part of Ser. No. 10/815,293 filed Apr. 1, 2004 now U.S. Pat. No. 7,419,912.

BACKGROUND

The present invention relates to light emitting diodes and in particular relates to such diodes that incorporate Group III nitride active layers on transparent substrates, such as silicon carbide, in an orientation in which the active layers are adjacent the mounting structure while the structural substrate forms the emitting face of the diode. Such an arrangement is often referred to as a "flip chip" light emitting diode.

Light emitting diodes ("LEDs") are one type of photonic devices; i.e. those in which a forward current generates light (photons), or in which photons generate a forward current (photodetectors). Because light emitting diodes are solid-state devices, they share the long lifetime, high reliability, and robust physical characteristics of many other semiconductor devices. Additionally, light emitting diodes that can produce white light are becoming commercially more common, with the potential to compete with or replace many types of existing artificial lighting (e.g., incandescent, florescent, vapor).

Silicon carbide and the Group III nitrides (i.e., binary, ternary and quaternary compounds of Ga, Al and In with nitrogen) are semiconductor compounds of significant interest for LEDs because their wide bandgaps enable them to generate higher frequency photons under forward current. These higher frequencies are in turn represented by the green, blue, violet, and ultraviolet portions of the electromagnetic spectrum. Accordingly, such diodes can be combined with lower frequency red and yellow diodes to produce a combination of frequencies that together produce white light. Alternatively, they can be used to excite phosphors which emit colors (typically yellow) that together with the blue emission produce white light.

As between silicon carbide (SiC) and the Group III nitrides, the Group III nitrides are becoming more preferred for the active portions of wider-bandgap LEDs because the wavelengths at which they emit can be tuned to some extent by the atomic composition of the nitride, and because they are direct rather than indirect emitters. Silicon carbide nevertheless provides a useful substrate material for Group III nitrides because it can be conductively doped, is physically, chemically and thermally robust, can be formed to be transparent, and provides a suitable crystal lattice match for the nitride compositions.

From a practical standpoint, an LED's useful emission is best understood and measured by the amount of light that actually leaves the device and can be externally perceived. Stated differently, photons generated by the active layers (junction) in a device are initiated in all directions. Accordingly, maximizing the number of these photons that actually exit the device in the direction of the desired transmission of light is a practical goal.

Because of the well-understood implication of Snell's law, photons reaching the surface (interface) between the semiconductor material and the surrounding atmosphere will be either refracted or internally reflected. If internally reflected repeatedly, the photons are eventually reabsorbed and never offer visible light that leaves the device.

Therefore, in order to maximize the opportunity for photons to exit an LED, particularly flip-chip devices in which the transparent silicon carbide substrate represents the exposed surface, it has been found useful to pattern the silicon carbide into geometric shapes that increase the probability of refraction over internal reflection, and thus enhance light extraction. Exemplary (but not limiting) techniques and structures are set forth in commonly assigned U.S. patents and co-pending U.S. published applications U.S. Pat. Nos. 6,888,167; 6,821,804; 6,791,119; 6,747,298; 6,657,236; 20050194603; 20050194584; 2005151138; the contents of which are incorporated entirely herein by reference.

Other current methods for improving light extraction include lapping or otherwise mechanically roughening the appropriate surfaces, or bevel-cutting the chip. Nevertheless, such mechanical methods tend to induce or introduce stress into the material and can increase wafer breakage to an unacceptable extent, particularly on relatively thin wafers; e.g. those thinner than about 125 microns. Mechanical methods are also limited in terms of the position in the fabrication sequence in which they can be employed. Bevel cutting is slow and requires special diamond saw blades that are relatively expensive and also tend to reduce yield.

The practical employment of lens-type (lenticular) structures has remained limited, however, because the techniques for producing the structures typically include complex, multi-step photo processes, or the use of complex gray tone lithography masks to pattern resist layers. Other techniques create pillars in the resist using standard photolithography, following which the pillars are reheated (reflowed) to create spherical-shaped structures.

Nevertheless, these techniques tend to be impractical for high-volume manufacturing and are of more limited use with silicon carbide or other material systems that do not etch at a 1:1 ratio to a polymer in a dry etch transfer process. When the etch rate selectivity is below 1:1 (substrate:resist) the resulting features will be flattened or reduced in radius as compared to the original pattern. This in turn reduces the light extraction efficiency of the resulting surface because of the deviation from desired or targeted critical angles.

As another factor, in order for the lenticular features to be most useful, they should be positioned as close as possible to the emitting layers of the LED. All other factors being equal, a thicker non-lenticular layer, even if transparent, tends to increase the probability of undesired internal absorption or reflection.

Accordingly, a need exists for improved techniques for producing shaped (lens, lenticular) features in silicon carbide for incorporation in flip chip type light emitting diodes.

SUMMARY

In one aspect, the invention is a method of obtaining a high-resolution lenticular pattern on the surface of a light emitting diode. The method comprises imprinting a patterned sacrificial layer of etchable material that is positioned on a semiconductor surface that is in turn adjacent a light emitting active region, and thereafter etching the imprinted sacrificial layer and the underlying semiconductor to transfer an imprinted pattern into the semiconductor layer adjacent the light emitting active region.

In another aspect, the invention is an LED precursor structure comprising a substrate, at least one Group III nitride active layer on the substrate, at least one layer of (single crystal) silicon carbide on the Group III nitride layer, a photoresist layer on the silicon carbide layer, and an embossing stamp pressed into the photoresist layer.

In another aspect, the invention is a method of obtaining a high resolution lenticular pattern on a wide bandgap light emitting diode. The method comprises adding a photoresist layer to the surface of a silicon carbide layer which in turn is on at least one Group III nitride active layer which in turn is on a submounting structure, heating the photoresist layer to a temperature sufficient to internally soften the photoresist but less than the temperature at which the photoresist would lose its self resolution structure, imprinting the heated photoresist layer with an embossing stamp that carries the negative image of the pattern desired for the photoresist, removing the stamp from the photoresist to leave behind an embossed patterned photoresist, curing the patterned photoresist, and removing the entire patterned photoresist layer in a plasma etch along with corresponding portions of the underlying silicon carbide layer to produce a lenticular pattern in the silicon carbide layer corresponding to the embossing stamp, the embossed photoresist, and the etching ratio between the photoresist and the silicon carbide in the plasma etch.

In another aspect, the invention is a method of obtaining a lenticular surface on a light emitting diode precursor. The method comprises adding a planarizing material to a plurality of silicon carbide mesas and adjacent trenches on a common Group III nitride layer which in turn is on a submounting structure, removing the planarizing material from the surface of the silicon carbide mesas while permitting the material to remain in the trenches between adjacent silicon carbide mesas and to thereby present a common planar surface of silicon carbide and planarizing material, adding a photoresist layer to the common planar surface, imprinting the photoresist with an embossing stamp, removing the embossing stamp from the imprinted photoresist, and etching the photoresist to completely remove the photoresist, the planarizing material and portions of the underlying silicon carbide to produce a lenticular pattern in the silicon carbide defined by the embossed photoresist and the etch ratio between the photoresist and the silicon carbide in the etching material.

In another aspect, the invention is an LED comprising a conductive substrate, at least one light-emitting active layer on the substrate, and a patterned semiconductor lenticular surface on the active layer opposite the substrate with no more than 25 microns of non-lenticular material between the patterned lenticular surface and the active layer.

The foregoing and other objects and advantages of the invention and the manner in which the same are accomplished will become clearer based on the followed detailed description taken in conjunction with the accompanying drawings.

DETAILED DESCRIPTION

Expressed broadly, the invention is a method of obtaining a lenticular semiconductor surface on a light emitting diode by imprinting (as opposed to lithography) followed by etch transfer. A number of aspects of the method, and the resulting structures, are illustrated in the drawings. For descriptive purposes, the method steps and the resulting structures are described in terms of Group III nitrides and silicon carbide, but other materials can be incorporated where appropriate. The use of Group III nitrides in light emitting diodes is generally well-established in this art and will not be otherwise described in detail.

In this specification, terms such as "light emitting portion" or "active layer" or "active region" will be clear in context. As is familiar to those of skill in this art, photons are generated when recombination events take place within one or more layers of semiconductor materials. The simplest structure in which this occurs is the p-n injunction, and such could comprise the active region of devices described in the context of the present invention. More complex structures for the active region can include single quantum wells, multiple quantum wells, and superlattice structures.

Figure 1:
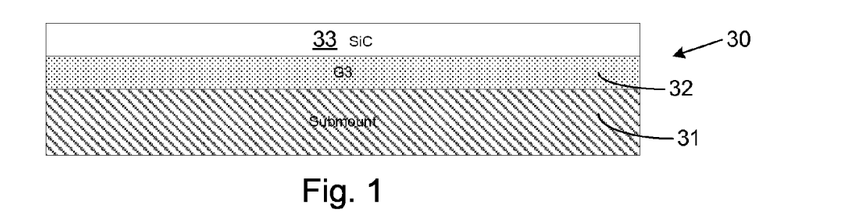
FIGS. 1 through 6 are cross-sectional schematic diagrams of one embodiment of the method according to the present invention and the resulting chip structure.

FIG. 1 is a schematic cross-sectional diagram of an LED precursor structure broadly designated at 30. The precursor 30 is often in the form of a wafer and includes a sub-mounting structure (which can be a single element or several components) 31. In the finished diode, the submounting structure is typically conductive and is used to physically and electrically connect the diode to a lead frame, a circuit, or some other desired structure. The light emitting portion is formed of at least one, and typically several, Group III nitride layers that together are designated at 32, and a silicon carbide substrate 33, which is typically a single crystal. FIG. 1 illustrates the substrate 33 as being relatively thin and on top of the Group III nitride active layer(s) 32 in a manner consistent with the "flip chip" orientation favored for certain light emitting diodes. Such flip chip diodes are described in the several other co-pending applications and issued patents incorporated above, and are commercially available from Cree, Inc. in the XB™ model designation, among others.

Figure 2:
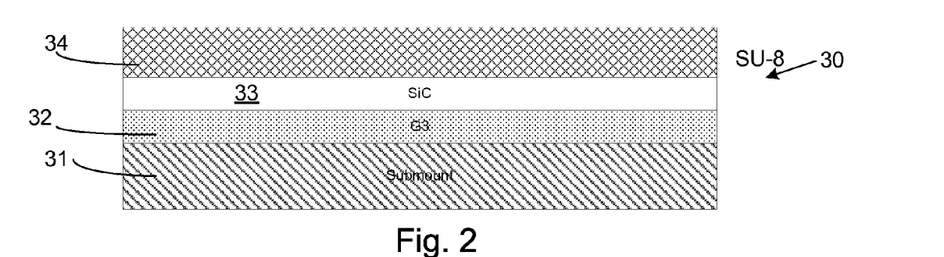

In a first step (FIG. 2), the invention comprises adding a sacrificial layer 34 of etchable material to the substrate surface that is intended to carry the lenticular structure. As will be described herein in more detail, the sacrificial layer is formed of a material that can be imprinted with an embossing stamp 35 to receive and maintain the transferred design, that can be cured to fix the embossed pattern for the etching step, and that can be etched from the semiconductor material at a reasonable selectivity rate in order to produce the resulting features in the lenticular surface.

For a number of reasons, the compounds that are commonly referred to as photoresists, and that are used for designing and building microelectronic devices and circuits using photolithography, are suitable for this purpose. Accordingly, much of the discussion herein refers to photoresists, but it should be understood that the qualifications for the material need not be the characteristics that make photoresists useful for photolithography, but instead are those characteristics that make them reasonable to apply, set, emboss, cure, and etch. Accordingly, other polymers that are not necessarily classified as photoresists are suitable if they otherwise have these properties and avoid interfering with the structure of the diode or any of the other steps of the method of the invention. For example, certain UV-curable liquid polymers can serve as the sacrificial layer 34. Many of these polymers do not dry to the touch and thus must be handled somewhat differently than photoresist (e.g., by carrying out the UV exposure with the stamp 35 in place). Other possible materials can include thermosetting or other thermally curable resins (including epoxies) that are cross-linked by heat rather than by exposure to UV radiation. Additional resins can include the two-part epoxies that react upon mixing and require neither external heat nor ultraviolet radiation. The curing time should be sufficient to allow time for the stamping process, but this can be typically controlled by the formulation and mixing ratio of the two epoxy precursors.

Thus, in one embodiment of this first step (FIG. 2), the invention comprises adding a layer of the soft photoresist 34 to the silicon carbide substrate 33 of the precursor structure 30. In exemplary embodiments, the photoresist (or "resist") 34 is an epoxy based negative resist available from Micro-Chem Corp. (Newton, Mass.) under the SU-8 designation. Exemplary and suitable compositions for the photoresist 34 have high functionality, high optical transparency and are sensitive to near UV radiation.

The photoresist 34 is typically added by spin coating, in a manner well-understood by those of ordinary skill in this art. The SU-8 resist dries to the touch at room temperature and is then "pre-" or "soft-" baked to evaporate solvent and density the film. Baking times and temperatures are based upon the particular resin formulation and are typically suggested by the resist manufacturer. As an example, the SU-8 resins are typically pre-baked at about 65° C. for a very few (1-5) minutes and then at about 95° C. for another few (1-15) minutes.

The method includes minimizing the amount of the photoresist as initially applied to in turn minimize or eliminate the amount (thickness) of the photoresist between the embossed features and the semiconductor surface. Minimizing or eliminating the thickness of the non-embossed remainder of the photoresist increases the resolution of the resulting features in the etched semiconductor by avoiding excessive etching against the planar remainder of the photoresist beneath the embossed features.

Figure 3:
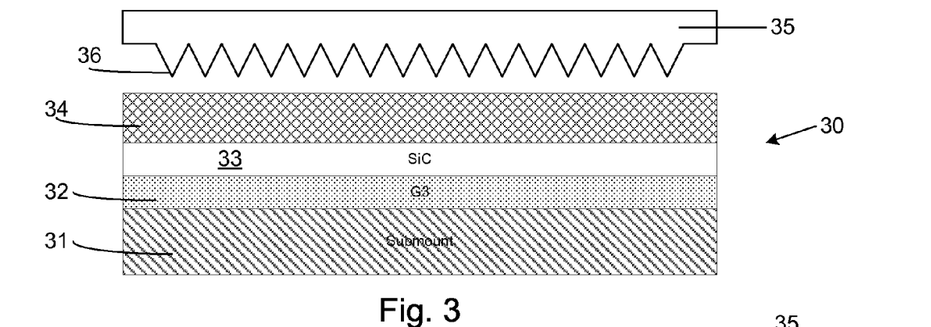

FIG. 3 is another schematic diagram that illustrates the precursor structure 30 and the soft embossing tool 35 that is used in conjunction with the present invention and as will be described later herein in more detail.

Figure 4:
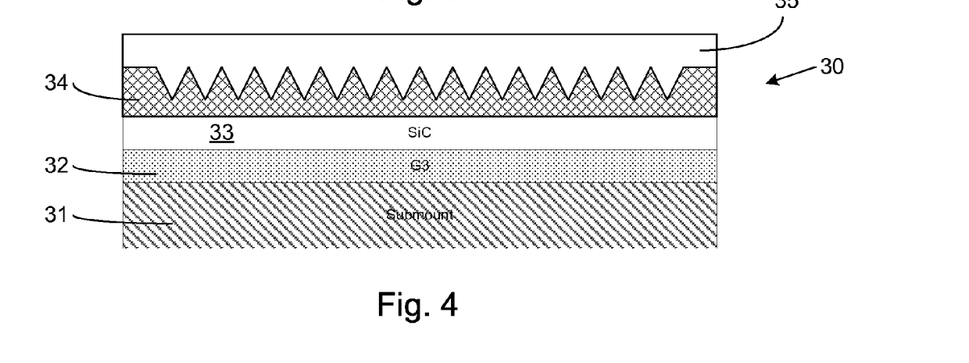

In the next step of the method of the invention, and as illustrated in FIG. 4, the precursor wafer 30 is heated for about 15 seconds at a temperature sufficient for the resist to receive the imprinting pattern after which the embossing stamp 35 is pressed into the photoresist 34. The embossing stamp 35 carries a negative image of the features desired in the photoresist 34. On the embossing stamp 35, these features are illustrated schematically as a plurality of pyramids 36, but it will be understood that a variety of feature shapes can be incorporated using the invention.

Figure 5:
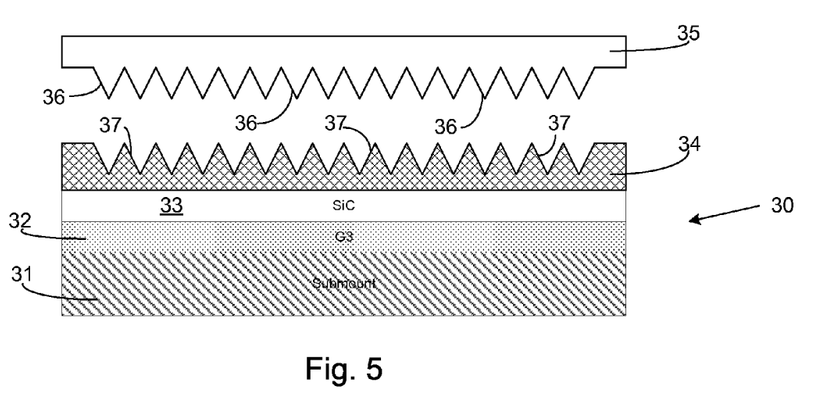

After cooling the wafer for about 30 seconds, the method next comprises separating the stamp 35 from the photoresist 34 and the remainder of the precursor structure 30 (FIG. 5). The soft embossing stamp 35 offers the advantage of releasing relatively easily from the photoresist 34. In contrast, "hard" embossing stamps that are often used in such processes are more difficult to remove and the removal step can damage the desired optical features.

As used herein with respect to the stamp, the term "soft" refers to an embossing stamp 35 that is formed from a polymer (e.g., polycarbonate) master. In some embodiments, the master is in turn produced using a laser machining process that incorporates technology such as the Exitech "Synchronized Image Scanning" (SIS) process (Exitech, Inc.; Sunrise Fla.; USA). Appropriate techniques are set forth in commonly assigned U.S. Patent Application Publication No. 20050227379, the contents of which are incorporated entirely herein by reference. The laser machined polycarbonate master is used to produce a flexible silicone (typically polydimethlysiloxane; "PDMS") stamp in an appropriate mold. Such silicone compounds can incorporate high resolution (i.e., in some cases sub-micron) patterns from a master, usually through well-understood processes such as casting or injection molding. As a result, the embossing tool 35 (or a plurality of tools) can be produced relatively quickly and inexpensively from the polycarbonate master. In contrast, producing a similar tool using photolithography is (although technically feasible) much more expensive. Thus, the present invention provides a technique that can be readily replicated and used in mass production to selectively create textured surfaces on a wafer scale.

It will be understood, however, that although a soft stamp offers certain advantages, the method of the invention is limited neither to soft stamps nor to laser-produced masters. Materials such as quartz, silicon and polycarbonate can also be used as the master or as the embossing stamp. If desired or necessary, a release coating (e.g., Applied Microstructures, Inc., San Jose, Calif., USA) can be included to provide a less-stressful separation of the stamp from the semiconductor. Water-soluble polymers (Transfer Devices, Santa Clara, Calif., USA) can also be used on a one-time basis, and these avoid separation problems entirely because the stamp simply dissolves in water following the embossing step.

Similarly, the master can be produced by techniques other than laser etching that nevertheless produce the required geometry and resolution. These can include wet etching techniques such as those available from Molecular Imprints, Inc. (Austin, Tex., USA).

In a next step—i.e., after separating the stamp 35 from the wafer 30—the photoresist 34 is cross-linked by exposure to ultraviolet light (e.g., frequencies of about 350-400 nanometers (nm) for about two minutes), and then baking below the glass transition temperature of the polymer. As is well understood in this art, the UV light generates an acid and the baking step drives an acid-initiated, thermally-driven epoxy cross-linking reaction. The post-embossing baking step is initially carried out below the glass transition temperature (Tg) in order to avoid undesired softening of the photoresist 34 and a corresponding loss in feature resolution. Optionally, once the photoresist is sufficiently cross-linked to remain dimensionally stable at higher temperatures (and thus maintain the resolution of the imprinted pattern), the baking temperature can be ramped up above the glass transition temperature to finish curing the photoresist without risk of loss of resolution.

As noted above, although "hard" stamps can be used in the process, soft stamps can be easier to remove in the separation step without damaging the resist or the precursor structure. In this regard, the soft stamp can be molded to include one or more flexible strips of a material such as fiberglass or steel. These strips can provide an additional mechanical advantage through which the stamp can be removed from the cooled resist.

Figure 6:
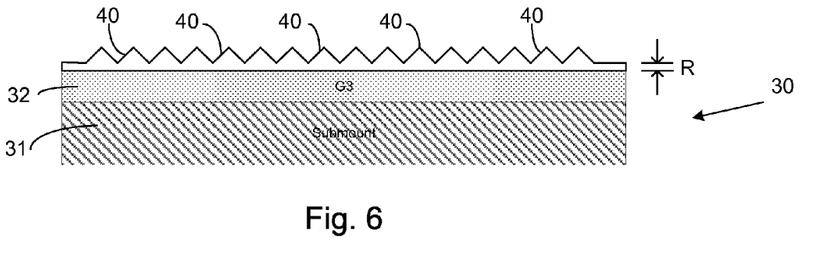

As the final step, and as illustrated by the progression between FIG. 5 and FIG. 6, the photoresist 34 is etched, for example in an inductively coupled plasma (ICP) or a reactive ion etch, to completely sacrifice the photoresist 34 and produce the resulting features in the silicon carbide. In exemplary embodiments a fluorine-based (e.g., $SF_6$) etch is used for silicon carbide and a chlorine based etch (e.g., $Cl_2$) is used for sapphire or gallium nitride. The resulting structure provides light extraction enhancements more than fifty percent greater than planar devices when employed in a flip chip orientation. The selection of particular etching parameters for these or other compositions can be made by those of skill in this art without undue experimentation. The etch speed and selectivity can be controlled or otherwise affected by generally well-understood factors such as the specific gas recipe (i.e., adding oxygen typically increases the rate at which photoresist etches) and the RF power settings.

Because of the resolution with which the embossing stamp can be manufactured, the resolution with which the embossing stamp can transfer the pattern into the photoresist, and the resolution that the etch can achieve, the semiconductor lenticular surface on the active layer can comprise a plurality of substantially identical lenticular features that are smaller than 10 microns across their individual footprints. In many cases lenticular features can be produced that are smaller than 6 microns, and features as small as 5 microns have been demonstrated. Indeed, the method can reproduce features as small as the master used to make the stamp. Stated differently, the master is the limiting factor. Thus, a master with 0.5 µm resolution will produce 0.5 µm lenticular features. As used herein, the term "footprint" refers to the area on the surface occupied by a single lenticular feature. As the photographs show, these features also become smaller as they extend upwardly from the surface.

Most favorably, the thickness of the silicon carbide layer 33 is minimized so that when combined with the embossing and etch resolution, as little silicon carbide as possible remains between the lenticular features and the active layers. With respect to the schematic drawings, this can be understood as minimizing or eliminating the dimension "R" illustrated in FIG. 6. A residual thickness of 25 microns or less is possible using the invention.

In another sense FIG. 5 illustrates a completed structure for some purposes. If desired, layer 34 can remain on the structure 30 at this point without further etching. This offers potential advantages in a flip chip orientation where both n-type and p-type contacts are on the same side of the chip and where the embossable material 34 can be closely index-matched to the substrate. For example, the layer 34 can be selected from a highly transparent, UV curable material that has an index of refraction closely matched to sapphire and could help increase light extraction with respect to sapphire. Materials of this nature include certain solgels (e.g. ORMOCER® polymers from Fraunhofer Gesellschaft, Munich, Germany).

When the layer 33 is silicon carbide, however, very few materials can match its high (and thus favorable for light extraction purposes) refractive index. Accordingly, using the structure illustrated in FIG. 5 as the final structure has greater potential advantage with respect to sapphire substrates than with respect to silicon carbide substrates (e.g., FIG. 6).

FIGS. 7 through 10 schematically illustrate another embodiment of the method of the invention.

Figure 7:
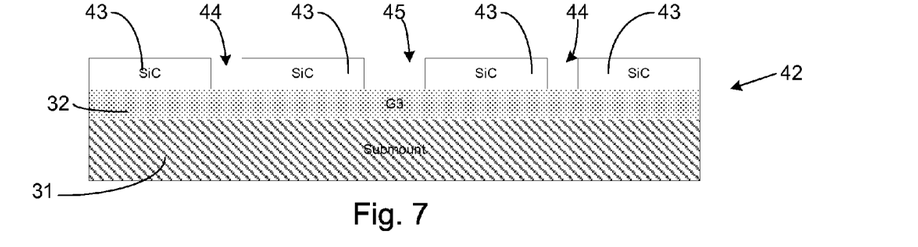
FIGS. 7 through 10 are cross-sectional schematic diagrams of a second embodiment of the method according to the present invention and the resulting chip structure.
Figure 8:
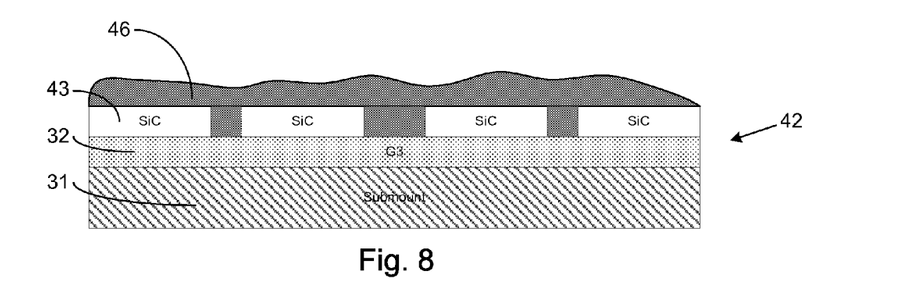

In FIG. 7, the substrate wafer is broadly designated at 42 and again includes the sub mounting structure 31 and Group III nitride portion 32. In comparison to FIG. 1, however, the silicon carbide portions of FIG. 7 are respectively designated at 43 because they have already been partially patterned—other than for light extraction purposes—in an etching step. FIGS. 7-10 illustrate these as silicon carbide mesas 43 separated by "trenches" or "streets" 44. Such etching of silicon carbide to delineate or identify individual device precursors is generally well understood in the art, can be carried out in conventional fashion, and will not be repeated herein in detail. Generally speaking, etching the silicon carbide into the mesas 43 provides the respective trenches 44 or other types of openings 45 for purposes such as device definition, electrical passivation or isolation, metal deposition, electrical contact to other portions of the structure, or any other appropriate purpose.

In order to carry out the steps of the invention on a wafer such as the one illustrated in FIG. 7, the surface should be preferably planar rather than formed of the silicon carbide mesas 43. Therefore, in a next step, a planarizing composition 46, a typical example of which is another resist or similar polymer, is added to the wafer 42 to fill the trenches 44 and the other openings 45. After the composition 46 is cured, the wafer 42 is polished to produce the structure schematically illustrated in FIG. 9 in which the silicon carbide portions 43 and the remaining resist portions 46 present a coplanar surface for further treatment.

Figure 9:
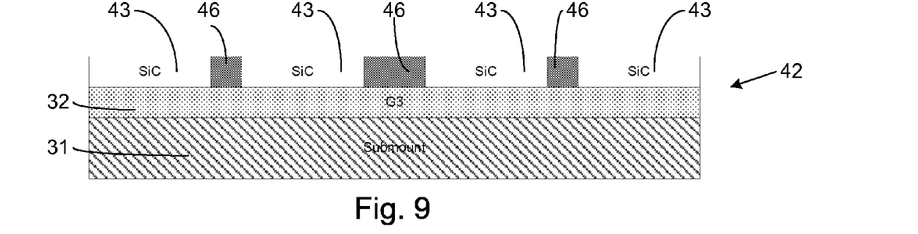
Figure 10:
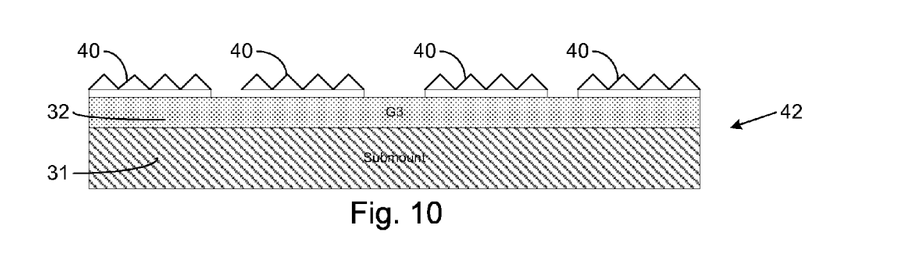

Using the wafer precursor structure 42 illustrated in FIG. 9, the steps illustrated in FIGS. 2 through 6 can be repeated to produce the structure illustrated in FIG. 10. As set forth earlier, the steps include applying the photoresist, embossing the photoresist 34 with the stamp 35, separating the stamp 35 from the wafer, and transfer etching using the inductively coupled plasma to produce the desired features 40 on the silicon carbide surface.

FIGS. 11 through 16 are photographs illustrating examples of the invention.

Figure 11:
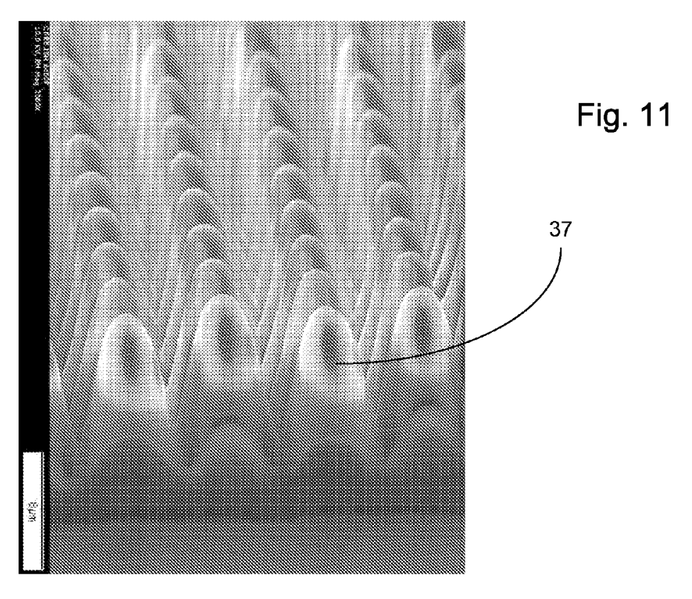
FIGS. 11 through 16 are photomicrographs of preliminary and finished structures according to the present invention.

FIG. 11 is a photograph showing the embossed features in the photoresist and are correspondingly labeled at 37 in a manner consistent with, for example, FIG. 5.

Figure 12:
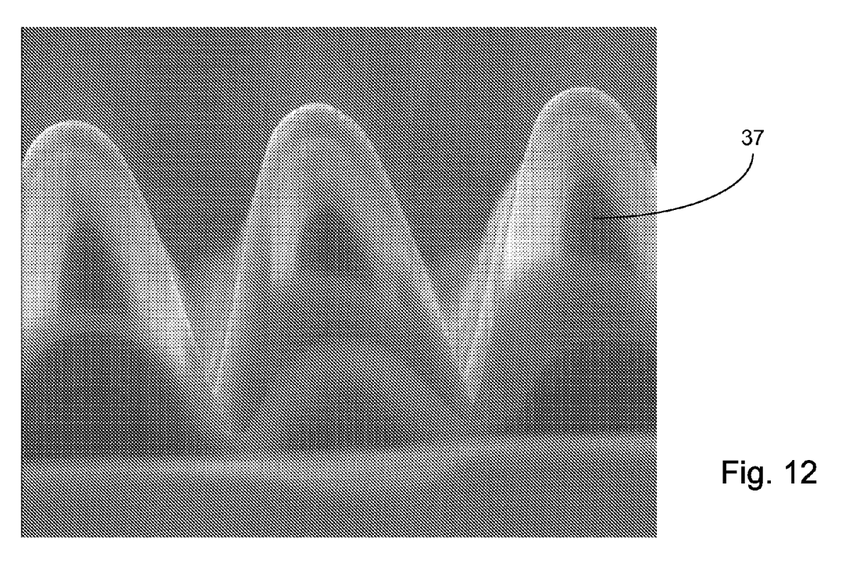

FIG. 12 is a view similar to FIG. 11 but taken at a higher magnification.

Figure 13:
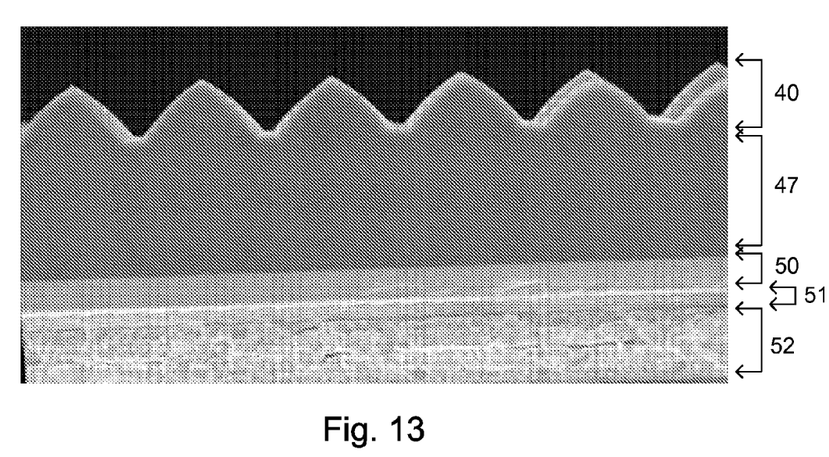
Figure 14:
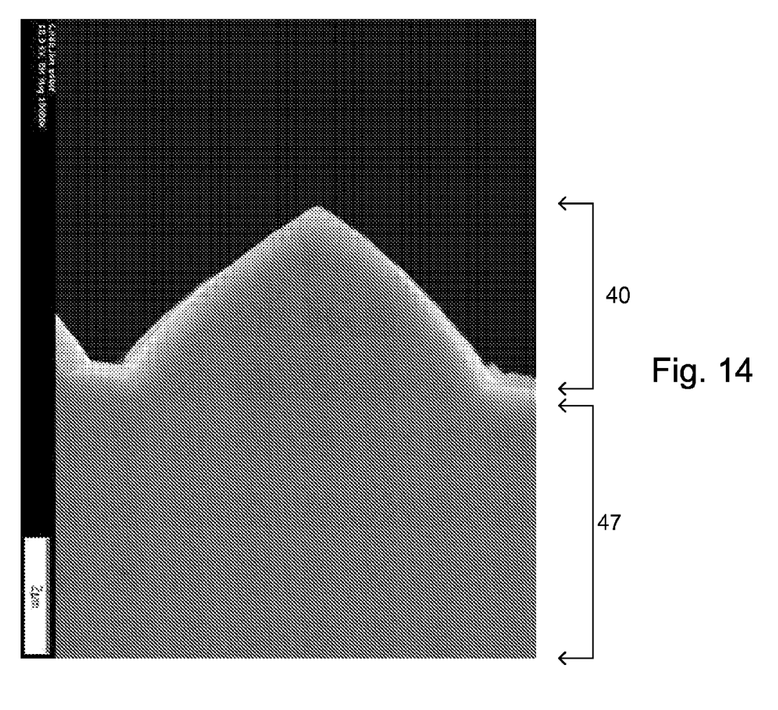

FIGS. 13 and 14 are cross-sectional views of the etched silicon carbide features 40 following completion of the sacrificial etch of the photoresist and the partial etch of the silicon carbide. Comparing FIGS. 11 and 12 to FIGS. 13 and 14 illustrate that the shape of the embossed photoresist is not replicated exactly in the silicon carbide, but is moderated by the etch rate selectivity between the semiconductor material (e.g., silicon carbide) and the particular photoresist (e.g., SU-8). For example, the embossed photoresist features 37 illustrated in FIGS. 11 and 12 have a height of about 12 microns, while the finished etched features 40 in the silicon carbide illustrated in FIGS. 13 and 14 have a height of between about 3.5 and 4 microns and are spaced between 8 and 9 microns from one another.

Accordingly, the method of the invention includes the step of creating the features 37 in the sacrificial mask layer 34 that have an aspect ratio (height versus area) sufficient to compensate for the etch rate differential between the photoresist and the semiconductor material (silicon carbide) and thereby produce features in the semiconductor material (silicon carbide) that exhibit the desired shapes, particularly the angles of the sidewalls.

The typical dry etch rate selectivity of silicon carbide with respect to polymer materials such as the SU8 photoresist is between about 0.35:1 and 0.45:1; silicon carbide to resist. The invention is accordingly very flexible and offers the ability to compensate for etch rate selectivity of the polymer to the substrate and replicate the desired structures in high volume. Another embodiment that tailors etch selectivity is described herein with respect to FIGS. 17-21.

FIG. 13 shows a number of layers of the overall structure 30 after being etched and thus corresponds generally (rather than exactly) to FIG. 6. The etched silicon carbide is again designated at 40, and the additional layers visible in FIG. 13 include an n-GaN layer 47, a p-GaN layer 50, barrier metals 51, and bonding metals 52.

FIG. 14 is an enlarged view similar to FIG. 13 and shows the lenticular SiC 40 and the n-GaN 47.

Figure 15:
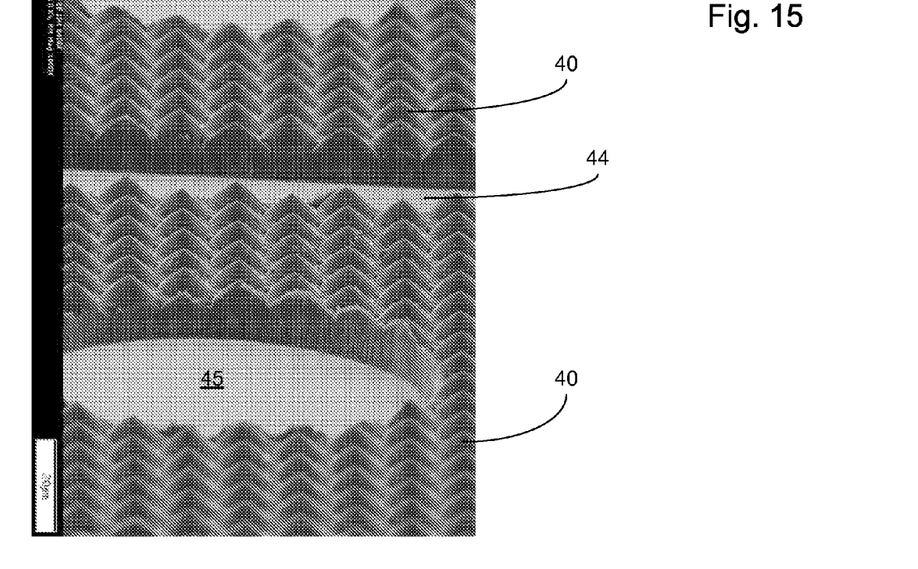
Figure 16:
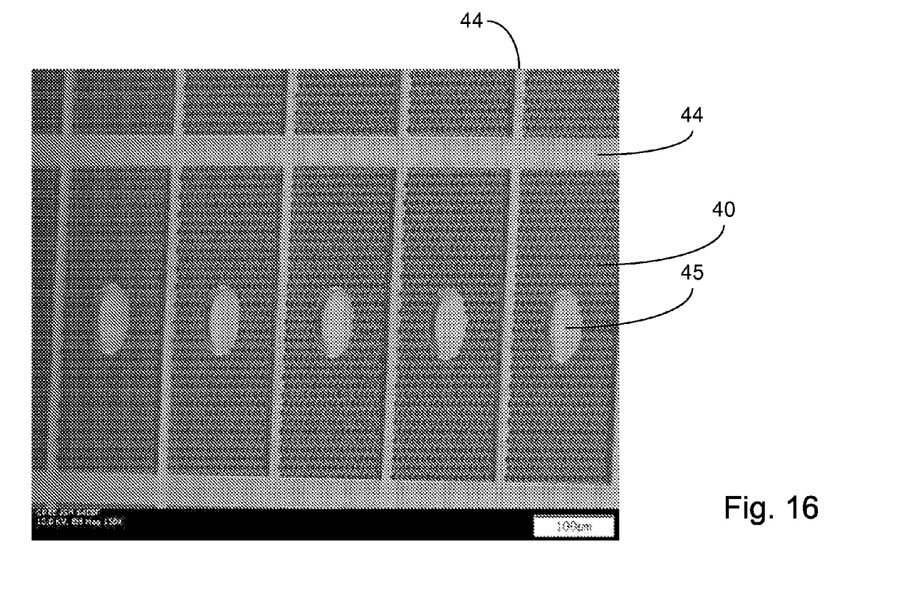

FIGS. 15 and 16 shows structures corresponding to the embodiment of the method and structures set forth in FIGS. 7 through 10. It will be understood that FIGS. 15 and 16 are finished structures and thus correspond most closely to FIG. 10 following the steps illustrated and described with respect to FIGS. 7, 8 and 9.

In FIGS. 15 and 16, the etched silicon carbide is again indicated at 40, and for the sake of comparison, the trenches 44 and other openings 45 are labeled in a corresponding manner in FIGS. 15 and 16. In FIGS. 15 and 16 the other openings are circular in shape and represent a position where a metal contact or related structure will be added to the precursor to form the resulting diode.

It will be understood, of course, that the features illustrated in FIGS. 15 and 16 are exemplary rather than limiting of the invention.

FIGS. 17-21 illustrates another embodiment of the invention in which an intermediate layer of etchable material is used in conjunction with the embossable material. FIGS. 17-21 illustrates a precursor structure 60 that includes a layer of such material at 61. In turn, the resist (or equivalent) layer is illustrated at 62, the semiconductor to be etched at 63, and a substrate or submount (if present) at 64.

The intermediate layer 61 adds the capability to tailor the etch selectivity of the process. The material for the intermediate layer 61 is chosen to have a desired etch selectivity with respect to both the semiconductor 63 and the resist 62. Although a number of materials may have such a desired selectivity, relatively few can be embossed or imprinted in the manner described herein. Combining a layer of the photoresist, however, with the intermediate material provides the capability to emboss the desired features into the resist 62, then etch the resist to transfer the pattern to the intermediate layer 61, and then transfer the pattern from the intermediate layer 61 to the desired semiconductor layer 63. Because the semiconductor layer 63 is etched from the intermediate layer 61 rather than from the resist 62, the etch selectivity is based upon the relationship between the intermediate layer 61 and the semiconductor 63 rather than the relationship between the resist 62 and the semiconductor 63.

Figure 17:
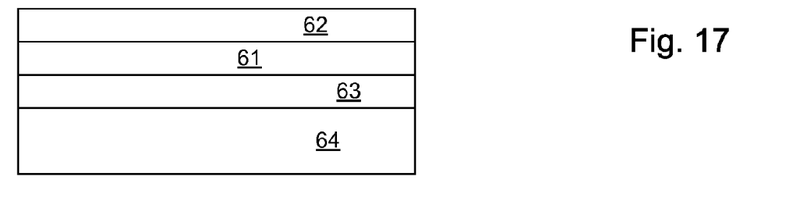
FIGS. 17-21 illustrate an embodiment of the invention in which an intermediate layer of material is used in conjunction with the embossed material.
Figure 18:
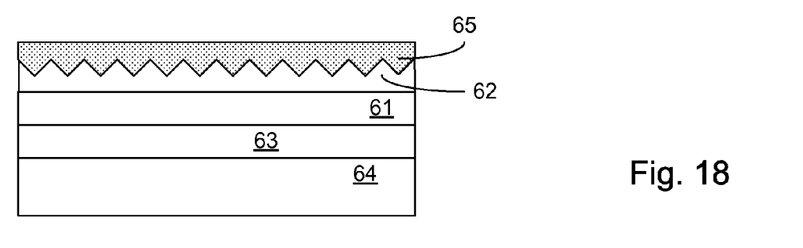
Figure 19:
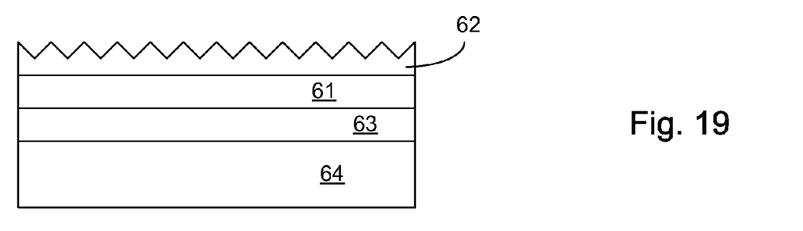
Figure 20:
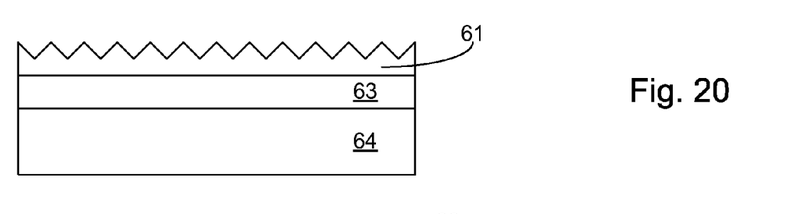
Figure 21:
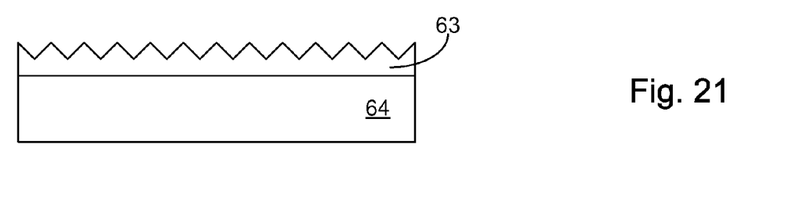
Figure 22:
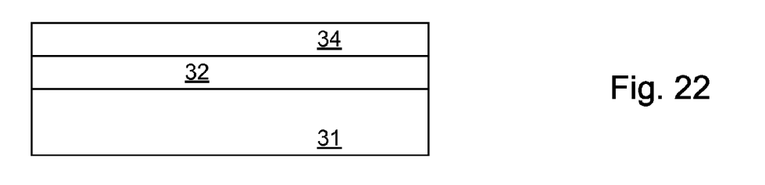
FIGS. 22-25A illustrate an embodiment of the invention in which a layer of Group III nitride material is etched rather than a silicon carbide or sapphire layer.
Figure 23:
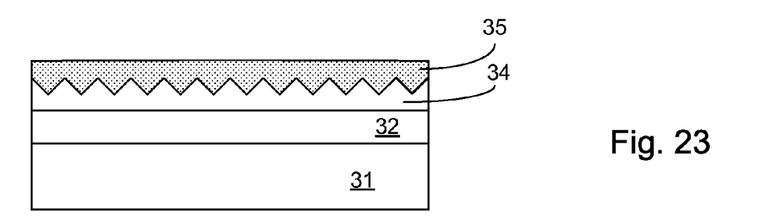
Figure 24:
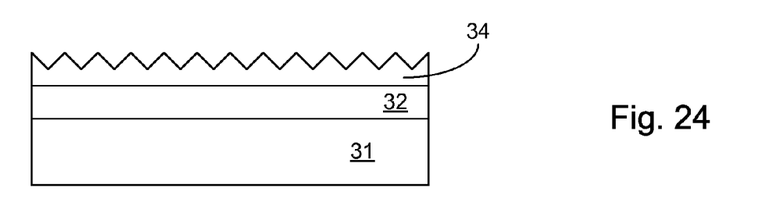

Accordingly, FIG. 17 shows (schematically) the starting structure. FIG. 18 shows the stamp 65 in place; and FIG. 19 shows the structure prior to the step of etching the resist 62. FIG. 20 illustrates the structure 60 and patterned intermediate layer 61 after the resist has been etched away. FIG. 21 shows the resulting structure after the intermediate layer has been etched away.

It will be understood that the intermediate layer 61 can be selected to either increase or decrease the etch selectivity (and thus tailor the resulting features) among and between the resist 62, the intermediate layer 61, and the semiconductor 63.

FIGS. 22-25 illustrate an embodiment of the invention in which a layer of Group III nitride material is etched rather than a silicon carbide or sapphire layer. The elements are otherwise numbered consistently with FIGS. 1-4. Starting with FIG. 22, the resist 34 is placed upon the Group III nitride layer 32 and then embossed (FIG. 23) as previously described to produce the structure illustrated in FIG. 24. Following the etching step, the resulting structure includes the patterned Group III nitride layer 32 on the substrate 31. As in the other embodiments, the substrate 31 can be a single crystal of sapphire or silicon carbide, or a submount structure of some other composition, or another Group III nitride layer.

Because a Group III nitride layer (e.g., 32) is typically thinner than a silicon carbide layer (e.g., 33 in FIG. 1), the embossing stamp 35 should include smaller features so that the desired resolution is still obtained after the photoresist 34 has been etched.

Figure 25:
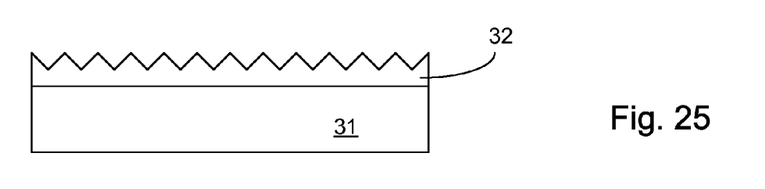
Figure 25A:
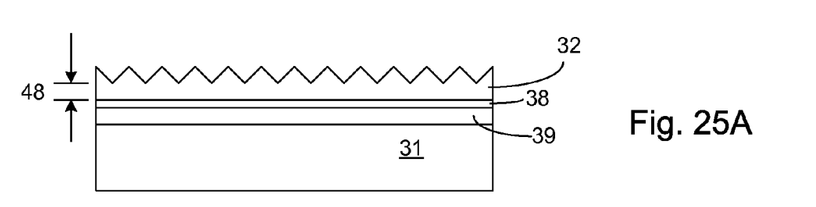

FIG. 25A illustrates that in many embodiments the etching is carried out on an n-type GaN layer 32 above the multiple quantum wells 38 (or other emitting structure) which in turn is on a p-type GaN layer 39. In such cases, a sufficient margin 48 should be maintained between the lenticular features and the quantum wells to preclude the etching step from adversely affecting the wells' structure or performance. To date, margins of at least about one micron and preferably at least about 1.5 microns have been found to be helpful.

In structures where the top layer is p-type GaN, the etching step may adversely affect the p-type character. Accordingly, in such circumstances an additional layer (such as indium tin oxide or another index-matched material) can be added on top of the p-GaN and the features can be etched into the additional layer.

FIG. 26-29 illustrate an embodiment of a precursor structure 72 in which the embossing stamp carries a masking pattern that permits (for example) a contact surface to be opened on either the material (e.g. silicon carbide) layer that will eventually carry the lenticular pattern, or on the underlying semiconductor material (such as the Group III nitride). Where appropriate, common elements carry the same reference numerals as in other of the drawings.

Figure 26:
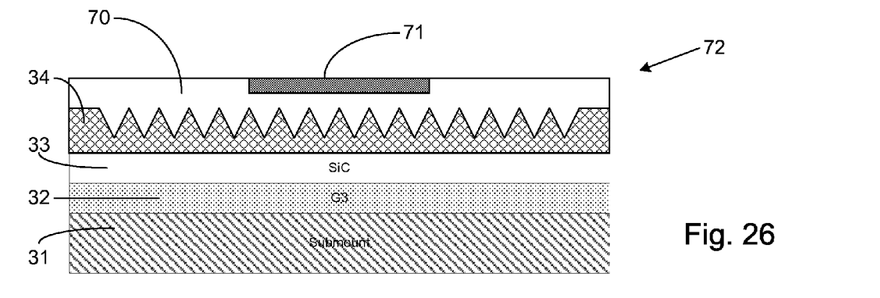
FIGS. 26-29 are cross-sectional schematic views of another embodiment of the invention in which an optical mask is used to produce a pattern complementary to the imprinted pattern in the photoresist.

Accordingly, FIG. 26 is generally analogous to FIG. 4 and includes the submount structure 31, the Group III nitride layer (or layers) 32, the silicon carbide layer 33, the resist (or other embossable material) 34 and the stamp, which for purposes of FIG. 26 is designated at 70. The stamp 70 includes a mask pattern schematically illustrated by the shaded rectangle 71. The mask pattern 71 can be formed of any material that prevents the underlying resist 34 from being exposed. In many circumstances, the patterning material is an opaque metal such as chromium that is unaffected by the (typical) UV exposure frequencies.

It will likewise be understood that although the mask 71 is illustrated as a single rectangle, it could be a more complex pattern as desired or necessary. Furthermore, the mask 71 need not be in the exact position illustrated in FIG. 26, but can be in a different vertical position (with respect to the stamp 70) provided it blocks the exposure in the intended manner.

Figure 27:
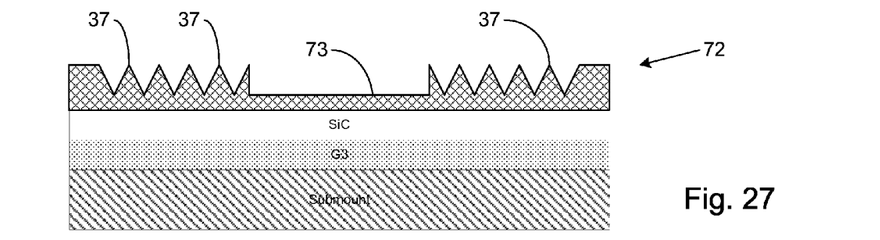

FIG. 27 illustrates the precursor structure 72 after the resist 34 has been developed and exposed. Because the mask 71 blocks and underlying portion of the resist 34 from exposure, some or all of the resist at that portion is removed during the developing step. Thus, FIG. 27 shows a small, unpatterned portion 73 of the resist remaining, but this is optional rather than necessary.

Figure 28:
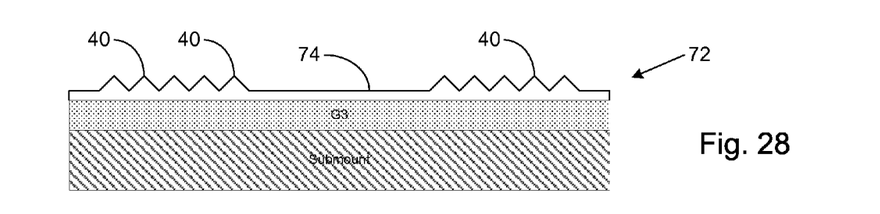

FIG. 28 illustrates the precursor structure 72 after the resist has been etched away. As in previous embodiments, the etching step transfers the pyramids (or other embossed pattern) 37 in the resist 34 to form the corresponding pyramids 40 in the silicon carbide layer 33. Because the flat (or removed) portion 73 of the resist does include the pyramids 37, the etching step produces a corresponding flat portion 74 of silicon carbide. It will be understood of course, that depending upon the desired final structure, etching can be carried out until the portion 74 disappears entirely (not shown) and thus leave an open area directly on the Group III nitride layer 32. The flat area 74 in the silicon carbide layer 33 provides an appropriate location for other structures, particularly an ohmic contact and related metal structures.

The basic steps of masking a photoresist to open a bond pad (or other feature) are generally well understood in the art. A standard contact aligner (e.g. SUSS MicroTec Inc., Waterbury Center, Vt. USA) can be used in otherwise standard and well-understood fashion.

FIGS. 26 through 28 illustrate a technique in which the mask is part of the embossing stamp 70 and the UV exposure is carried out with the stamp 70 in place. Alternatively, the stamp 70 can be removed, and then the remaining structure can be masked, and then the UV exposure and development carried out to produce the same structure illustrated in FIG. 27.

Figure 29:
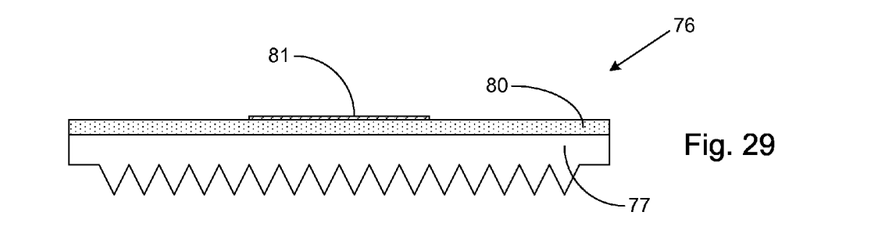

FIG. 29 illustrates another embodiment of the stamp broadly designated at 76. In this embodiment, the stamp 76 includes the patterned soft material (e.g., PDMS) 77 bonded to a hard material 80 such as quartz which can conveniently carry a masking pattern. The PDMS can be covalently bonded to the quartz 80 by treating both surfaces with oxygen plasma and then immediately bringing them into contact under light pressure.

The mask 80 can include the patterned layer 81 which, as in FIG. 26, will often include an appropriate opaque metal such as chromium.

From a method standpoint, FIGS. 26 through 29 illustrate the steps of imprinting a pattern into a layer of photoresist that is positioned on a semiconductor surface that is in turn adjacent a light emitting active region, then masking the photoresist with a complementary pattern, then exposing and developing the photoresist, and then etching the imprinted developed photoresist and the underlying semiconductor to transfer the imprinted and complementary patterns into the semiconductor layer adjacent to light emitting active region.

The photoresist can be imprinted with an embossing stamp as described previously herein and, under the appropriate conditions, the photoresist can be masked and exposed with the stamp in place.

Alternatively, the photoresist can be imprinted with the embossing stamp and the stamp can be removed from the photoresist and then the photoresist can be masked, exposed and developed as desired.

The embossing capabilities provided by the present invention offer a number of advantages. In some LED structures, the invention improves the far field pattern (i.e., more Lambertian) independent of any increase in brightness.

In another context, the embossing of the invention can be carried out on the backside of devices or precursors that are not necessarily packaged in a flip chip orientation. In such cases, the embossing improves the light extraction and also increases the uniformity of the emission.

In yet another context, the embossing can be carried out on a growth substrate, followed by epitaxial growth. This is particularly advantageous when sapphire is the substrate.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. An LED precursor structure comprising a substrate or submount:
   at least one Group III nitride active layer on said substrate or said submount;
   a photoresist layer on said Group III nitride-layer; and
   an embossing stamp pressed into said photoresist layer.

2. An LED precursor according to claim 1 wherein said photoresist layer is heated to a temperature sufficient to soften the photoresist but below the temperature at which the photoresist would lose structural integrity.

3. An LED precursor according to claim 1 heated to a temperature of between about 50 and 100° C.

4. An LED precursor according to claim 1 further comprising a conductive substrate supporting said Group III nitride layer.

5. An LED comprising:
   a conductive substrate;
   at least one light-emitting active layer on said substrate; and
   a patterned semiconductor lenticular surface on said active layer opposite said substrate with no more than 25 microns of non-lenticular material between said patterned lenticular surface and said active layer.

6. An LED according to claim 5 wherein said lenticular surface comprises a plurality of lenticular features that are smaller than 10 microns in their individual footprints.

7. An LED according to claim 5 wherein said lenticular surface comprises a plurality of substantially identical lenticular features.

8. An LED according to claim 5 wherein said lenticular surface comprises a plurality of lenticular features that are smaller than 6 microns in their individual footprints.

9. An LED according to claim 5 wherein said active layer comprises a Group III nitride.

10. An LED according to claim 9 wherein said lenticular surface comprises silicon carbide.

* * * * *